(12) United States Patent
Schwank et al.

(10) Patent No.: US 6,268,630 B1
(45) Date of Patent: Jul. 31, 2001

(54) SILICON-ON-INSULATOR FIELD EFFECT TRANSISTOR WITH IMPROVED BODY TIES FOR RAD-HARD APPLICATIONS

(75) Inventors: James R. Schwank; Marty R. Shaneyfelt; Bruce L. Draper, all of Albuquerque; Paul E. Dodd, Tijeras, all of NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/270,374

(22) Filed: Mar. 16, 1999

(51) Int. Cl.$^7$ .................................................. H01L 29/00
(52) U.S. Cl. .................... 257/347; 257/348; 257/349; 257/350; 257/351; 257/352; 257/353; 257/354; 257/355
(58) Field of Search ...................................... 257/347–355

(56) References Cited

U.S. PATENT DOCUMENTS

| | | | |
|---|---|---|---|
| 5,021,359 | 6/1991 | Young | 437/21 |
| 5,024,965 | 6/1991 | Chang | 437/57 |
| 5,137,837 | 8/1992 | Chang | 437/21 |
| 5,489,792 | * 2/1996 | Hu et al. | 257/347 |
| 5,517,047 | * 5/1996 | Linn et al. | 257/347 |
| 5,659,192 | 8/1997 | Sarma | 257/347 |
| 5,760,443 | 6/1998 | McCarthy | 257/347 |
| 5,795,813 | 8/1998 | Hughes | 438/423 |
| 5,807,771 | 9/1998 | Vu | 438/154 |
| 5,808,319 | * 9/1998 | Gardner et al. | 257/67 |

OTHER PUBLICATIONS

E.P. Ver Ploeg, T. Watanabe, N.A. Kistler, J.C.S. Woo and J.D. Plummer, "Elimination of Bipolar–Induced Breakdown in Fully–Depleted SOI MOSFETs," Technical Digest of the International Electron Devices Meeting, pp. 337–340 (IEEE, 1992).

* cited by examiner

*Primary Examiner*—Fetsum Abraham
(74) *Attorney, Agent, or Firm*—John P. Hohimer (57) ABSTRACT

A silicon-on-insulator (SOI) field-effect transistor (FET) and a method for making the same are disclosed. The SOI FET is characterized by a source which extends only partially (e.g. about half-way) through the active layer wherein the transistor is formed. Additionally, a minimal-area body tie contact is provided with a short-circuit electrical connection to the source for reducing floating body effects. The body tie contact improves the electrical characteristics of the transistor and also provides an improved single-event-upset (SEU) radiation hardness of the device for terrestrial and space applications. The SOI FET also provides an improvement in total-dose radiation hardness as compared to conventional SOI transistors fabricated without a specially prepared hardened buried oxide layer. Complementary n-channel and p-channel SOI FETs can be fabricated according to the present invention to form integrated circuits (ICs) for commercial and military applications.

44 Claims, 7 Drawing Sheets

"Prior Art"

SILICON-ON-INSULATOR FIELD EFFECT TRANSISTOR WITH IMPROVED BODY TIES FOR RAD-HARD APPLICATIONS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to silicon-on-insulator (SOI) devices, and in particular to radiation-hardened SOI field-effect transistors (FETs) for integrated circuits (ICs), and to a method for manufacturing the same.

BACKGROUND OF THE INVENTION

Silicon-on-insulator (SOI) integrated-circuit (IC) technology offers performance advantages over bulk-silicon or epitaxial-silicon IC technologies for commercial and military applications. SOI ICs can operate at higher speeds and lower power levels than equivalent bulk-silicon ICs, making the SOI ICs particularly useful for mobile communication and high-speed computer applications. These SOI ICs are also less prone to single-event upset (SEU) due to energetic cosmic particles which is important for deployment in outer space, in high-altitude aircraft, or in terrestrial systems.

Single-event upset can lead to system performance degradation or failure in space systems, and is becoming an increasing system reliability concern even in terrestrial systems. To SEU-harden bulk-silicon ICs to high cosmic ray levels, performance-degrading and/or area-degrading radiation hardening techniques must be currently used. Thus, SEU-hardened bulk-silicon ICs may not be compatible with future advanced complementary-metal-oxide-semiconductor (CMOS) technologies.

Silicon-on-insulator ICs can also function without upset or failure after exposure to extremely high dose-rate pulses of ionizing radiation. It is impossible to fabricate bulk-silicon ICs that can function at radiation dose levels achievable by properly designed SOI ICs. These radiation-hardness properties make SOI devices attractive for space and weapon applications. Because of the high levels of SEU and dose-rate radiation hardness obtainable by SOI circuits, system applications heretofore unimaginable with bulk-silicon ICs can be realized. However, the total-dose hardening of SOI devices is much more difficult than for bulk-silicon ICs due to a back-channel leakage current resulting from charge trapping in an oxide layer buried below the SOI devices.

The primary factor that leads to the SEU and dose-rate advantages of SOI technology over bulk-silicon technology is that SOI transistors are built in a thin silicon active layer (also termed a device layer) above a buried silicon dioxide ($SiO_2$) layer (also termed a buried oxide layer) rather than in a bulk silicon wafer. The SOI device layer is typically about 50–200 nanometers thick, compared to a thickness of about 725 $\mu$m for a bulk silicon wafer. In a conventional thin-film SOI field-effect transistor or complementary field-effect transistor pair (i.e. an inverter), a source region and a drain region are formed to extend completely through the device layer to the buried oxide below. Transistors in a bulk-silicon IC are formed in n-type or p-type wells that have been ion implanted into the wafer. The SEU hardness of an IC can be related to the charge collected after a cosmic-ray strike. For a bulk-silicon CMOS transistor, charge can be collected from a region several microns deep in the silicon wafer. On the other hand, for an SOI transistor, only the charge deposited within the very thin device layer is collected since the buried oxide layer electrically isolates the device layer from the remainder of the wafer. This provides a higher degree of SEU hardness for SOI devices than for bulk-silicon devices. Furthermore, the dose-rate hardness of an SOI device is superior to a bulk-silicon device since the SOI device has considerably less p-n junction area than the bulk-silicon device because the dose-rate hardness of an IC is related to the total p-n junction area of the IC.

Despite the inherent dose-rate and SEU hardness advantage of SOI technology, two factors can reduce the radiation hardness of SOI circuits. These two factors are floating body effects that degrade SEU and dose-rate hardness, and back-channel leakage that degrades total-dose ionizing radiation hardness. For a partially-depleted SOI transistor, the silicon depletion region does not extend completely through the device layer so that a thin silicon body region exists between the edge of the silicon depletion region and the silicon/buried oxide interface and between the source and drain of the transistor. In normal operation of the SOI transistor as a three-terminal device, this silicon body region is not tied to a specific electrical potential, but is instead floating. Thus, any charge generated within the body region by a cosmic ray strike can cause a reduction in a potential barrier between the source and the body region (i.e. a source-to-body potential). Similarly, electrical charge generated by impact ionization due to an increased current flow as a result of exposure to a high dose-rate pulse of ionizing radiation can cause a reduction in the source-to-body potential. As a result, a parasitic bipolar transistor effect can be initiated that can significantly increase the collected electrical charge. The magnitude of floating body effects can be sufficient to cause reliability degradation due to soft errors in conventional SOI transistors due to terrestrial cosmic rays. To prevent such floating body effects, body ties can be used to tie or electrically connect the body potential to a fixed electrical potential, generally at the same potential as the transistor source. Unfortunately, these body ties can significantly increase the size of the transistors so that most commercial SOI circuit designs use body ties only at critical locations.

The total-dose hardening of SOI ICs is more difficult than hardening bulk-silicon ICs due to the presence of the SOI buried oxide layer. Total-dose ionizing radiation-induced back-channel leakage occurs as positive electrical charge is trapped in the buried oxide near the bottom silicon/buried oxide interface. Typical SOI buried oxides contain numerous defects that result in considerable radiation-induced charge trapping. As charge is trapped in the buried oxide, the overlying silicon becomes inverted at the silicon/buried oxide interface, thereby forming a back-channel leakage current path between the transistor source and drain (see FIG. 3b). The back-channel leakage current can be substantial even at low levels of total-dose ionizing irradiation (see FIG. 3a), and can severely limit the lifetime of conventional SOI ICs in space systems. Techniques have been developed to fabricate hardened SOI buried oxides to minimize radiation-induced positive charge buildup near the back-channel interface. Unfortunately, the present processing techniques used to fabricate radiation hardened buried oxides are expensive to implement, are difficult to control, and are not compatible with standard IC processing equipment.

An advantage of the present invention is that a radiation-hardened SOI field-effect transistor can be fabricated with a significantly reduced radiation-induced back-channel leakage current, while retaining the SEU and dose-rate hardness advantages inherent to thin-film SOI technology.

A further advantage of the present invention is that the SOI field-effect transistor can be formed with a body tie contact extending along an entire conducting channel of the transistor, thereby reducing floating body effects during operation of the transistor.

Yet another advantage of the SOI field-effect transistor having the body tie contact is that the body tie contact can be formed without a significant increase in the area of the transistor.

Still another advantage of the SOI field-effect transistor having the body tie contact is that the body tie contact improves radiation hardening of the transistor, and in particular the single-event-upset hardening of the transistor.

A further advantage is that the SOI field-effect transistor of the present invention provides an improvement over conventional SOI transistors for terrestrial applications (e.g. consumer applications) as well as for space applications.

Yet another advantage of the present invention is that a radiation-hardened SOI integrated circuit can be fabricated comprising one or more complementary pairs of SOI field-effect transistors.

Still another advantage is that the SOI field-effect transistor of the present invention can be formed using a conventional SOI wafer without the need for a SOI wafer having a specially prepared hardened buried oxide layer.

A further advantage of the present invention is that the SOI field-effect transistor of the present invention has an improved radiation hardness to provide a prolonged lifetime in harsh environments.

These and other advantages of the present invention will become evident to those skilled in the art.

SUMMARY OF THE INVENTION

The present invention relates to a semiconductor field-effect transistor formed on a silicon-on-insulator wafer, and to a method for fabricating the same. The invention provides an improvement in both electrical characteristics and radiation hardness as compared with conventional SOI FETs.

The semiconductor field-effect transistor comprises an SOI wafer having a monocrystalline silicon substrate, an insulating layer of silicon dioxide overlying the silicon substrate, and a monocrystalline silicon device layer (generally up to 500 nanometers thick) overlying the insulating layer; a gate formed above the device layer; a drain formed on one side of the gate in the device layer and extending completely through the device layer; a source formed on the other side of the gate in the device layer and extending only partially through the device layer (e.g. about halfway); and a body tie contact formed adjacent to the source and electrically connected to the source. In some embodiments of the present invention, the body tie contact can comprise an Ohmic contact; whereas in other embodiments of the present invention, the body tie contact can comprise an ion implanted region that extends either partially or completely through the device layer. The electrical connection between the body tie contact and the source can be provided by a source contact; and the SOI FET can further include electrical contacts to the drain and gate. In the SOI FET, the gate preferably comprises a layer of polysilicon overlying a layer of silicon dioxide. Additionally, a sidewall spacer comprising silicon nitride or silicon dioxide is preferably provided on opposite sides of the gate above the drain and source.

The SOI FET can further include an isolation region formed about the transistor to electrically isolate the transistor from the remainder of the device layer, and from any other transistors formed in the device layer. The isolation region preferably comprises a trench filled with a field oxide that surrounds the transistor.

In the SOI FET, a region of the device layer between the source and drain (i.e. a body region) is doped by ion implantation with ions of a first conductivity type; whereas the drain and source are doped with ions of a second conductivity type. The region of the device layer between the source and drain can further have a retrograde doping profile. The body tie contact can also be doped by ion implantation with ions of the first conductivity type.

The electrical contacts to the SOI FET comprise a metal or metal alloy, preferably a metal silicide, and most preferably titanium silicide. Complementary pairs of transistors can be fabricated according to the present invention for use in forming an integrated circuit.

The body tie contact acts in combination with a region underneath the source to form a body tie which improves electrical characteristics of the device. Additionally, the SOI FET of the present invention provides a high level of radiation hardness.

The method for forming the SOI FET comprises steps for forming an island within a device layer of the wafer at a location wherein the field-effect transistor is to be formed, with the island being doped with ions of a first conductivity type and electrically isolated from the remainder of the device layer; forming a transistor gate over the island; forming a transistor drain on one side of the gate by implanting ions of a second conductivity type into the device layer with the implanted ions extending completely through the device layer; forming a transistor source on the other side of the gate by implanting ions of the second conductivity type into the device layer with the implanted ions extending only partially (e.g. half-way) through the device layer; forming a body tie contact adjacent to the source and electrically connected to the source, with the body tie contact acting in combination with a portion of the doped island underlying the source to form a body tie to improve performance of the device.

The method can further include a step for forming a sidewall spacer on opposite sides of the gate above the drain and source, with the sidewall spacer comprising a deposited and patterned layer of silicon nitride or silicon dioxide. Additionally, the method preferably includes an annealing step for activating the implanted ions.

According to the present invention, the step for forming the island within the device layer preferably comprises etching a trench into the device layer surrounding a region wherein the transistor is to be formed, and filling the trench with an electrically-insulating material. The step for forming the transistor gate preferably comprises forming a silicon dioxide layer over the device layer, depositing a polysilicon layer over the silicon dioxide layer, and patterning the polysilicon layer. The step for forming the transistor drain preferably comprises a plurality of implants of ions at different energies. The step for forming the transistor source preferably comprises implanting ions to a depth that is preferably equal to about one-half the thickness of the device layer, with the device layer generally being about less than 500 nanometers thick, and preferably in the range of 50–200 nanometers thick. The step for forming the body tie contact can include forming an Ohmic contact or alternately implanting ions of the first conductivity type into the device layer with the implanted ions extending partially or completely through the device layer. The method can further include a step for forming electrical contacts to the drain, source and gate, with the source contact further electrically connecting the body tie contact to the source.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

The present invention relates to a body-tied partially-depleted SOI transistor structure that is hardened to total-dose ionizing irradiation and that maintains the high dose-rate and SEU hardness levels intrinsic to SOI technology and to a method for fabricating the same. The present invention also provides electrical performance advantages over conventional SOI transistors so that the present invention can also be useful for terrestrial applications wherever transistors or integrated circuits (ICs) are used.

Figure 1:
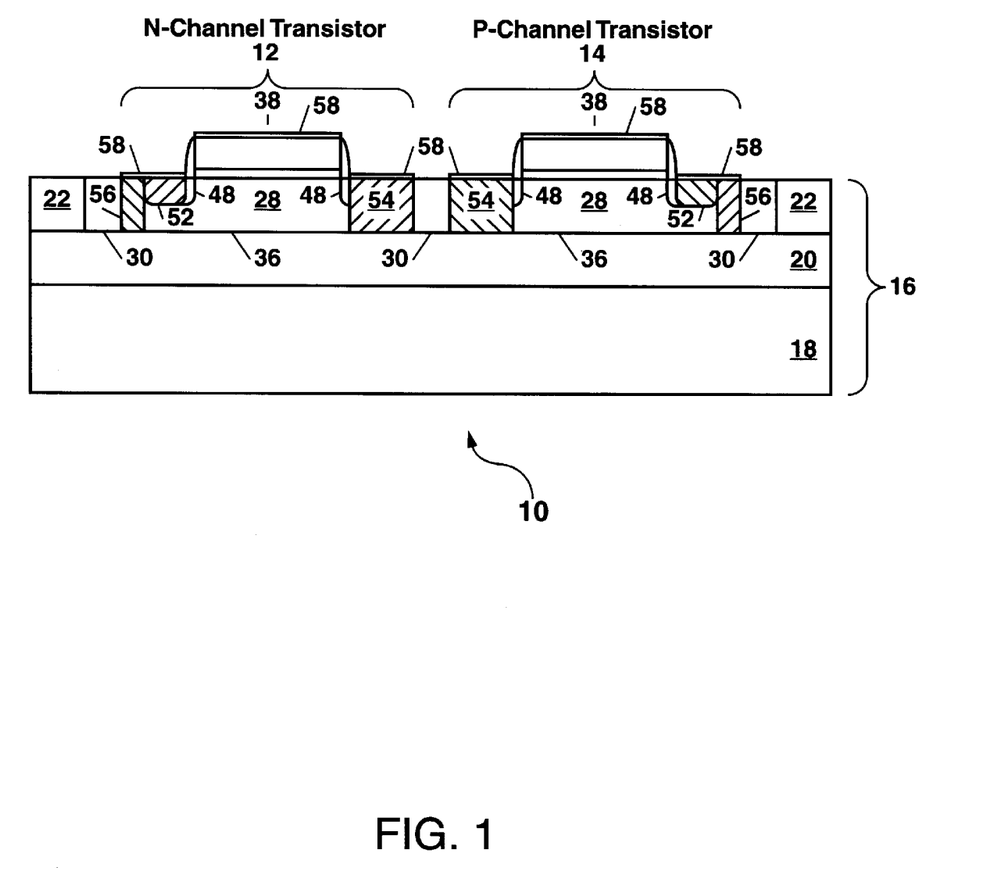
FIG. 1 schematically illustrates a cross-section view of a complementary pair of radiation-hardened SOI field-effect transistors formed according to the present invention.

The present invention can be used to form an IC 10 comprised of complementary pairs of n-channel SOI field-effect transistors 12 and p-channel SOI field-effect transistors 14 as shown in the schematic cross-section representation in FIG. 1. Additional circuit elements such as resistors and capacitors (not shown in FIG. 1) can also be used to form the IC 10 in combination with the transistors 12 and 14.

The SOI field-effect transistors 12 and 14 of the present invention are different from conventional devices in two important respects that improve their radiation hardness and reduce floating body effects: (1) the source 52 of the transistors 12 and 14 of the present invention does not extend completely through the device layer 22; and (2) next to the source 52 is provided a heavily-doped body tie contact 56 that extends partially or completely through the device layer 22 and electrically connects to a body or channel region under the source 52. The transistors 12 and 14 of the present invention can be termed as "Body Under Source FETs" or BUSFETs.

An advantage of limiting the depth of the source 52 according to the present invention is that the effects of radiation-induced back-channel leakage in the transistors 12 and 14 are significantly reduced or eliminated compared to conventional devices having a source that extends completely through the active layer. Thus, according to the present invention, there is no direct current conducting path between the source 52 and drain 54 in the transistors 12 and 14 even when a back-channel interface 36 is inverted by charge trapped in an underlying buried oxide layer 20 due to total-dose ionizing irradiation. This substantially improves the radiation hardness of the transistors of the present invention to total-dose ionizing irradiation as compared with conventional SOI transistors. Furthermore, the channel region under the source 52 is also used in combination with the body tie contact 56 to form an effective body tie for the transistors 12 and 14.

In FIG. 1, the transistors 12 and 14 are formed on an SOI wafer 16 which comprises a substrate 18 of monocrystalline silicon upon which is disposed an electrically insulating buried oxide layer 20 comprising silicon dioxide ($SiO_2$), and a monocrystalline silicon device layer 22 above the layer 20. SOI wafers 16 are commercially available, and can be formed by different methods including a separation by implantation of oxygen (SIMOX) process and a wafer bonding process. With the present invention, specially-hardened SOI wafers are not required, thereby reducing cost and increasing wafer availability. The SOI wafer 16 has a total thickness of generally less than one millimeter, with the device layer 22 typically being up to 500 nanometers thick, and with the buried oxide layer 20 being, for example, about 100–400 nanometers thick.

FIGS. 2a–2k are schematic cross-section representation views of an n-channel transistor 12 during fabrication. Although the method of the present invention will be described in terms of fabrication of a single n-channel transistor 12, it will be understood by those skilled in the art that a plurality of both n-channel and p-channel transistors can be formed simultaneously on the same wafer 16 using the same or similar process steps. Furthermore, the fabrication of an integrated circuit (IC) comprising a plurality of n-channel transistors 12 and p-channel transistors 14 can require up to hundreds of individual process steps. Therefore, only the relevant process steps for the present invention will be described herein in detail since those skilled in the art understand other conventional IC processing steps such as photolithography, masking, etching, mask stripping, cleaning, metallization and deposition of dielectric and passivation layers.

Figure 2A:
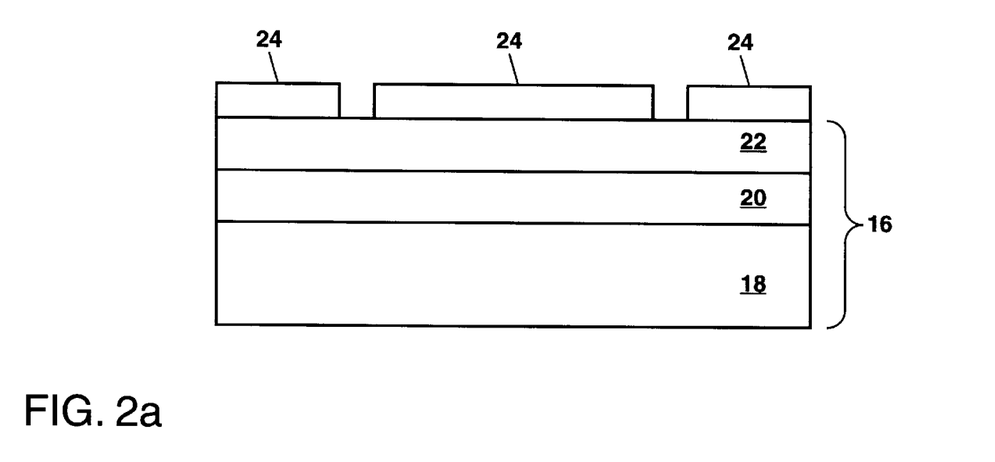
FIGS. 2a–2k schematically illustrate a series of process steps for fabricating the transistors of FIG. 1.

FIG. 2a shows the formation of a patterned mask layer 24 blanketing the device layer 22 of the SOI wafer 16 in preparation for etching a trench 26 down through the device layer 22 to form an isolation region about an island 28 wherein the n-channel SOI field-effect transistor 12 is to be formed, thereby electrically isolating the transistor 12 from the remainder of the device layer 22. Islands 28 used for forming p-channel SOI transistors 14 can be formed in the same step.

Figure 2B:
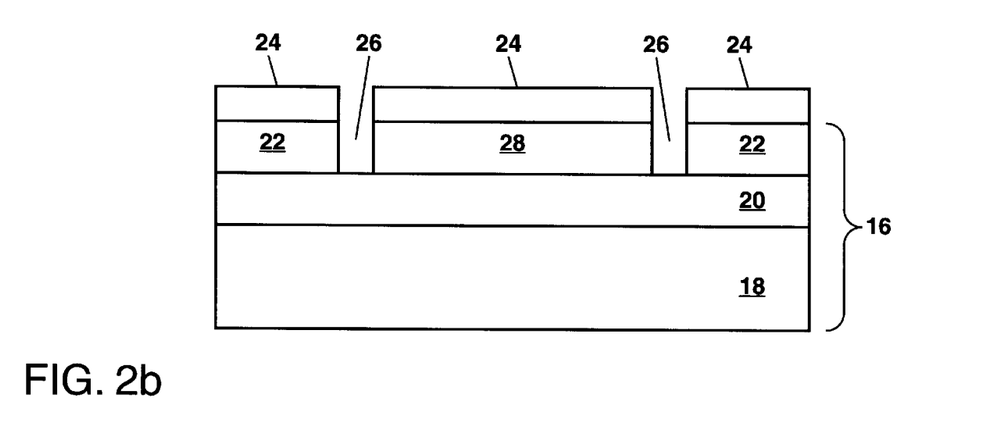

In FIG. 2b, a trench 26 can be etched through the device layer 22 to form each island 28 and to isolate that island 28 from the remainder of the device layer 22. This is preferably done using a dry etching process such as reactive ion etching. The trench 26 can extend completely through the device layer 22 as shown in FIG. 2b; or alternately the trench 26 can extend most of the way through the device layer 22, with the underlying silicon then being thermally oxidized for conversion to silicon dioxide.

Figure 2C:
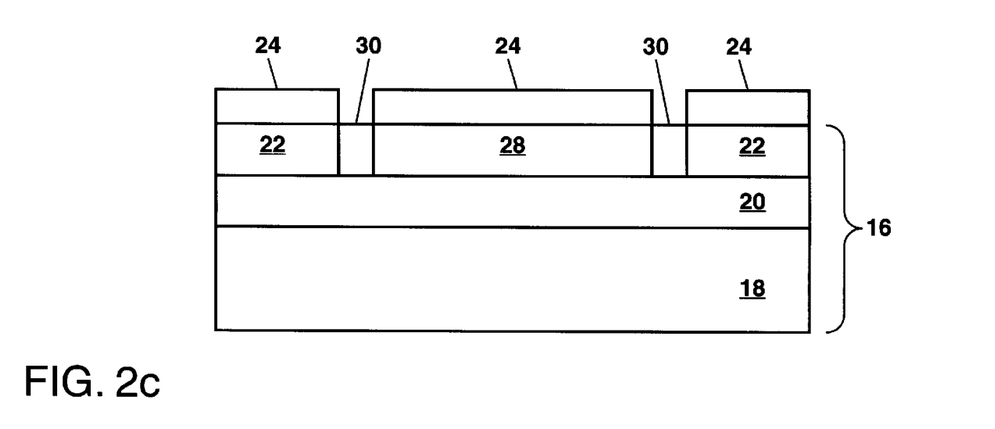

In FIG. 2c, a field oxide 30 (e.g. $SiO_2$ or a silicate glass) can be formed in the trench 26 (e.g. by thermal oxidation of the silicon surrounding the trench 26) or deposited therein to fill up the trench 26 to planarize the wafer 16. The field oxide 30 electrically isolates each island 28 from the remainder of the device layer 22; whereas the buried oxide layer 20 electrically isolates each island 28 from the underlying silicon substrate 18. Any of the field oxide 30 extending above the device layer 22 can be removed by etching, or by chemical-mechanical polishing to planarize the wafer 16.

Figure 2D:
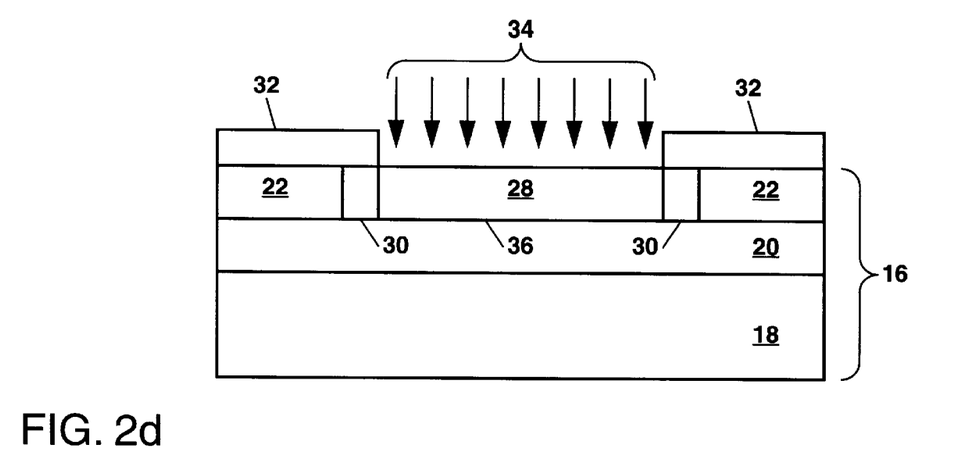

In FIG. 2d, a patterned implant mask 32 is formed over the wafer 16 with an opening through to the island 28. P-type dopant ions 34 (e.g. boron) are then ion implanted into the island 28 to dope the island p-type for forming an n-channel transistor 12. Alternately, this step can be performed before the trench 26 is etched.

In FIG. 2d, the island 28 can be uniformly doped to a dopant concentration of, for example, $10^{17}$–$10^{18}$ $cm^{-3}$. An alternate method for doping the island 28 is to use a retrograde doping profile wherein the island dopant concentration is increased with depth from about $10^{17}$ $cm^{-3}$ at the top of the island 28 to about $10^{18}$ $cm^{-3}$ or more at a back-channel interface 36 of the island 28 with the underlying buried oxide layer 20. This retrograde doping profile can be achieved by initially uniformly ion implanting the island 28 to about $10^{17}$ $cm^{-3}$ and then providing an additional ion implant in the island 28 near the interface 36 with the buried oxide layer 20 to increase the dopant concentration at this location to about $10^{18}$ $cm^{-3}$ or more after thermal activation. The use of a retrograde doping profile is advantageous for further increasing the total-dose hardness that can be obtained in the transistors, 12 and 14, by minimizing the depth of a depletion region at the back-channel interface 36 to aid in prevention of the formation of a conducting path between the source 52 and drain 54 near the back-channel interface 36. Also, high doping at the bottom of the island 28 near the interface 36 will improve the effectiveness of the body tie formed by a portion of the doped island 28 underlying the source 52 acting in combination with a body tie contact 56. The goal here is to provide a doping level that is as high as possible without causing junction breakdown. Additional masking and ion implantation steps can be used for n-type doping of particular islands 28 reserved for p-channel transistors 14 to similar dopant concentrations and profiles using arsenic or phosphorous as the n-type dopant.

Figure 2E:
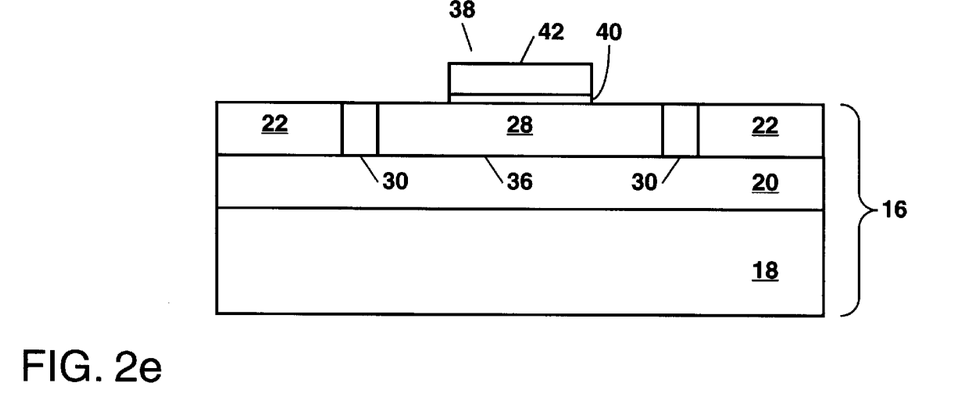

In FIG. 2e a transistor gate 38 is formed over a central portion of the island 28. This can be done by forming a thin thermal oxide 40 comprising about 5–15 nanometers thickness of silicon dioxide on an upper surface of the island 28, and then depositing and patterning a polysilicon (i.e. polycrystalline silicon) layer 42 over the thermal oxide 40. The thermal oxide can be formed using a conventional oxidation process (e.g. by exposing the wafer to a dry oxygen ambient at 900° C. for one-half hour). The polysilicon layer 42 can be deposited by low-pressure chemical vapor deposition (LPCVD) at a temperature of about 580° C. The gate 38 can be rectangular in shape with a length of, for example, 0.1–2 $\mu$m and a width of, for example, 0.75–10 $\mu$m to form transistors 12 and 14 operating at a voltage of 1–5 volts.

In FIGS. 2f–2i, a series of process steps are used to form a drain region 44 and a source region 46 in the island 28 on opposite sides of the gate 38.

Figure 2F:
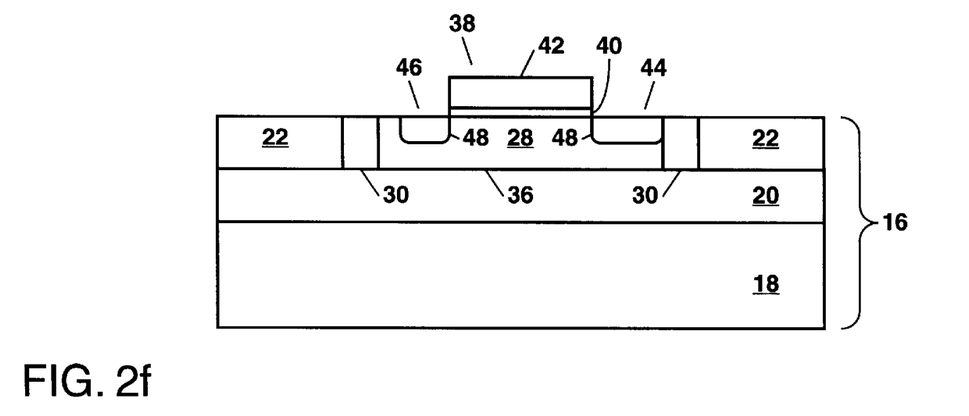

In FIG. 2f, lightly-doped regions 48 are ion implanted into the drain and source regions, 44 and 46, respectively to reduce the electric field and thereby reduce hot carrier effects. The lightly-doped regions 48 extend only partially through the thickness of the device layer 22. For example, if the device layer 22 has a thickness of 180 nanometers, the depth of the lightly-doped regions 48 is preferably about 90 nanometers (i.e. about one-half the thickness of the device layer 22). In this example, arsenic is preferably used as the n-type dopant to form the n-type lightly-doped regions 48 for each n-channel transistor 12. The arsenic can be ion implanted at an energy of, for example, 30 keV and a dose of about $10^{13}$ $cm^{-2}$ to provide a dopant concentration after thermal activation in the range of $5 \times 10^{18}$–$1 \times 10^{19}$ $cm^{-3}$. To form each p-channel transistor 14, a p-type dopant such as boron can be ion implanted to a similar dose, thereby forming p-type lightly-doped regions 48 on opposite sides of the gate 38.

Figure 2G:
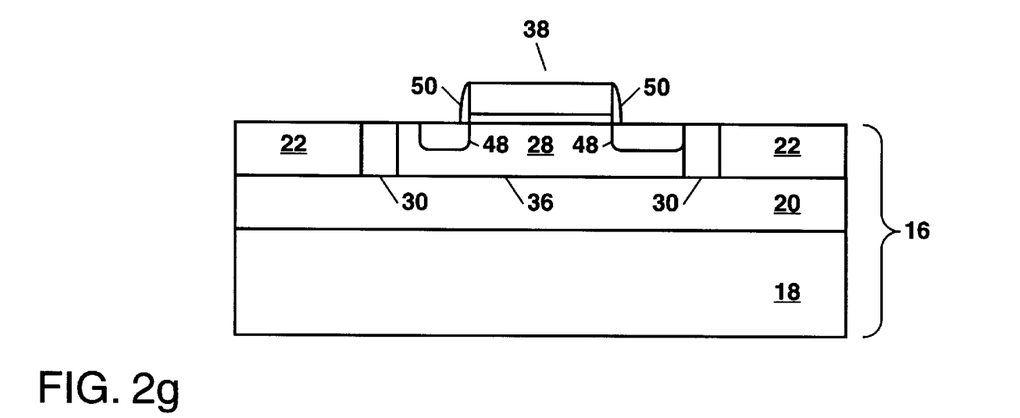

In FIG. 2g, a sidewall spacer 50 is preferably formed on each side of the gate 38 above the device layer 22 and above the lightly-doped regions 48. The sidewall spacers 50 can be formed by blanket depositing about 100 nanometers of silicon nitride (e.g. by LPCVD) or silicon dioxide over the SOI wafer 16, and then removing a horizontally-disposed portion of the deposited material by anisotropic dry etching (e.g. reactive ion etching) to leave a vertically-disposed portion (i.e. a fillet) that forms the sidewall spacers 50 as shown in FIG. 2g.

Figure 2H:
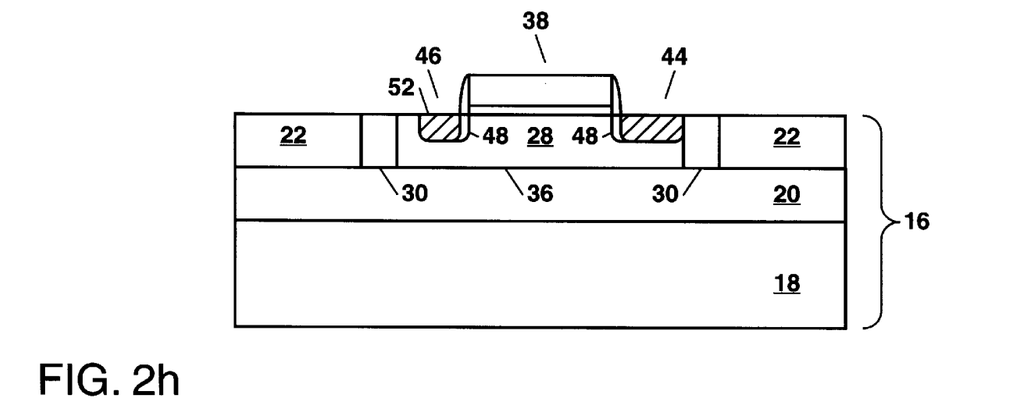

In FIG. 2h, the drain and source regions, 44 and 46, of each n-channel transistor 12 are implanted with an n-type dopant that substantially overlaps the earlier implant forming the lightly-doped regions 48. This can be done using the same photomask previously used for forming the lightly-doped regions 48. The n-type dopant used for this step is preferably arsenic which can be ion implanted at an ion beam energy of 30 keV and a dose of $2 \times 10^{15}$ $cm^{-2}$ for the example of a 180-nanometer-thick device layer 22. Upon activation, this implant provides a heavy doping level of about $10^{20}$ $cm^{-3}$ extending about half-way through the thickness of the device layer 22 and forming an n+source 52 for the n-channel transistor 12. To form a p$^+$ source 52 for each p-channel transistor 14, boron can be substituted for the arsenic in the above ion implant step.

Figure 2I:
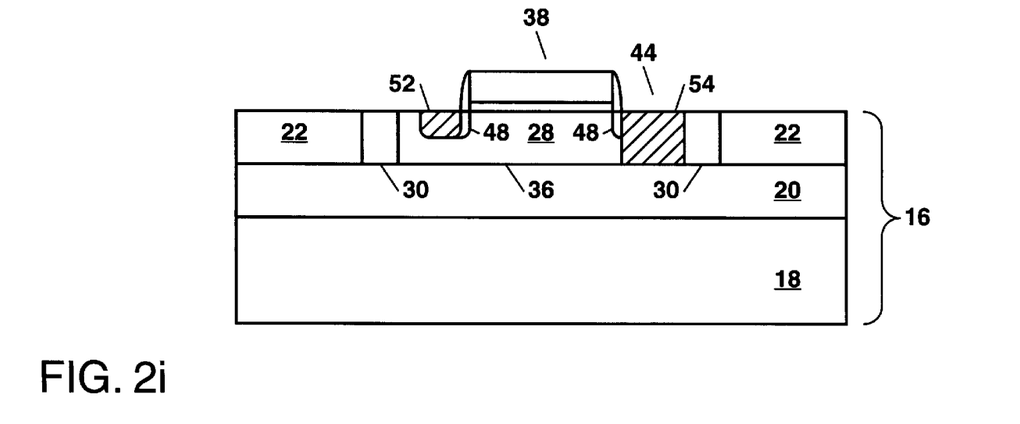

In FIG. 2i, an n$^+$ drain 54 for each n-channel field-effect transistor 12 can be formed using an additional deep implant step wherein an n-type dopant is implanted to laterally overlap the earlier implants in the drain region 44 and to extend completely through the thickness of the device layer 22. For this step, arsenic is preferably used as the n-type dopant, and can be ion implanted at an ion beam energy of 100 keV and a dose of $4 \times 10^{15}$ $cm^{-3}$. Upon activation, the doping level in the deep n$^+$ drain 54 will be about $10^{20}$ $cm^{-3}$. A deep p$^+$ drain 54 can be similarly formed for each p-channel transistor 14 in the IC 10, using boron in place of arsenic as the dopant.

Figure 2J:
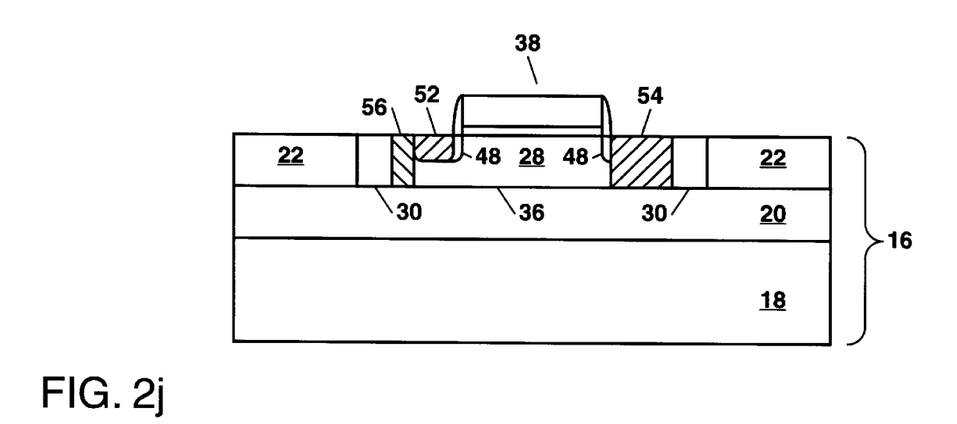

In FIG. 2j, a body tie contact 56 is formed for each radiation-hardened field-effect transistor, 12 or 14. In some embodiments of the present invention, the body tie contact 56 can comprise an Ohmic contact formed over a portion of the doped island 28 between the source 52 and the adjacent field oxide 30, with the body tie contact 56 further being electrically connected to the source 52. In other embodiments of the present invention as shown in FIGS. 1–2, the body tie contact 56 comprises a highly doped region produced by ion implanting an impurity dopant into a region between the source 52 and the adjacent field oxide 30. The body tie contact 56 can extend partially or completely through the thickness of the device layer 22. FIG. 2j shows a body tie contact 56 that extends completely through the island 28 to the underlying buried oxide layer 20.

The body tie contact 56 electrically connects to the body under the source 52 to form a body tie that maintains an entire active channel of the transistor 12 or 14 at a fixed electrical potential, thereby significantly reducing any voltage drops along the channel caused by high electrical currents due to a high dose-rate pulse of ionizing radiation, or due to a cosmic ray strike near the center of the active channel. The body tie contact 56 can thus minimize floating body effects which can otherwise make SOI circuit design difficult and result in increased design margins at the expense of circuit speed and power dissipation. Furthermore, the body tie contact 56 can be small in area so that the combination of the body tie contact 56 and the source 52 occupy about the same space as the drain 54. The provision of the body tie contact 56 can thus substantially improve the radiation hardness and electrical performance of the SOI field-effect transistor of the present invention as compared to conventional devices.

For an n-channel transistor 12 with an ion implanted body tie contact 56 as shown in FIG. 2j, a high p$^+$ doping level of about $10^{20}$ cm$^{-3}$ is used. This high p$^+$ doping level can be achieved using a boron implant at an energy of 30 keV and $2\times10^{15}$ cm$^{-2}$ dose for the example of a 180-nanometer-thick device layer 22. For a p-channel transistor 14, arsenic can be implanted to form the body tie contact 56.

It should be noted that, when the body tie contact 56 extends to the underlying buried oxide layer 20 as shown in FIGS. 1 and 2j, a single n-type dopant implant step (e.g. arsenic) can be used to simultaneously form the deep implants for the n$^+$ drain 54 of a plurality of n-channel transistors 12 and n$^+$ body tie contacts 56 for a plurality of p-channel transistors 14. Similarly, in the example of FIGS. 1 and 2j, a single p-type dopant implant step (e.g. boron) can be used to simultaneously form the deep implants for the p$^+$ drain 54 of a plurality of p-channel transistors 14 and p$^+$ body tie contacts 56 for a plurality of n-channel transistors 12. For a device layer 22 of a different layer thickness from the above example, the ion beam energy can be adjusted for the above ion implant steps to provide the desired depth of penetration for the ions as recited above.

After the various ion implantation steps are performed, the wafer 16 can be annealed to activate the implanted dopant ions. This annealing step can be performed for example by heating the wafer 16 to a temperature of 900° C. for 60 minutes. Alternately, rapid thermal annealing can be used to activate the implanted ions.

Figure 2K:
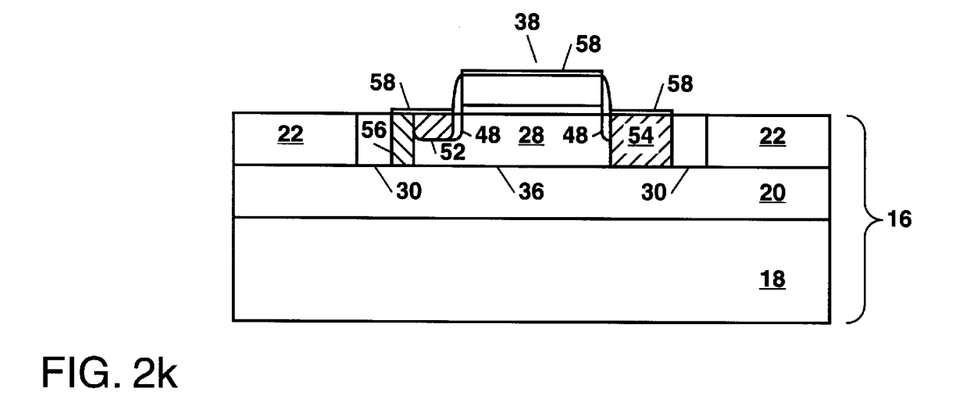

In FIG. 2k, electrical contacts 58 are formed over the gate 38, source 52 and drain 54 of each transistor, 12 and 14. Although the electrical contacts 58 can comprise any deposited or sputtered metal or metal alloy conventionally used for ICs (e.g. aluminum, or copper, or an alloy of aluminum or copper), the electrical contacts 58 according to a preferred embodiment of the present invention comprise a metal silicide (e.g. cobalt silicide or titanium silicide), and preferably titanium silicide. The titanium silicide can be formed by a self-aligned silicide process (termed "SALICIDE"). In this process, titanium is blanket deposited over the wafer 16 to a layer thickness of about 50 nanometers by sputtering and is then reacted with the underlying silicon in a rapid thermal annealing system to form titanium silicide. Any unreacted titanium (e.g. overlying the sidewall spacers 48 and overlying the titanium silicide) is then removed using a conventional wet etchant for titanium.

The contact 58 overlying the source 52 and the body tie contact 56 in FIG. 2k serves to short-circuit these two regions, thereby minimizing any radiation-induced photocurrent generated at a p-n junction formed at the interface between the source 52 and the body tie contact 56. As described previously, in some instances, an Ohmic contact 58 can be used to form the body tie contact without any need for an ion implanted region 56.

The process for forming each p-channel transistor 14 is similar to that described above for the n-channel transistor 12 except that a p-type dopant (e.g. boron) is substituted in each instance for the n-type dopant (e.g. arsenic), and vice versa. As mentioned previously, some implant steps can be used to simultaneously form elements of both the n-channel transistors 12 and the p-channel transistors 14. The net result is that a minimum of only two additional mask levels are required beyond that needed for the fabrication of conventional CMOS ICs. These two additional mask levels include one for deep n$^+$ ion implantation of drains of n-channel transistors 12 and body tie contacts of p-channel transistors 14, and another for deep p$^+$ ion implantation of body tie contacts of n-channel transistors 12 and drains of p-channel transistors 14.

Figure 3A:
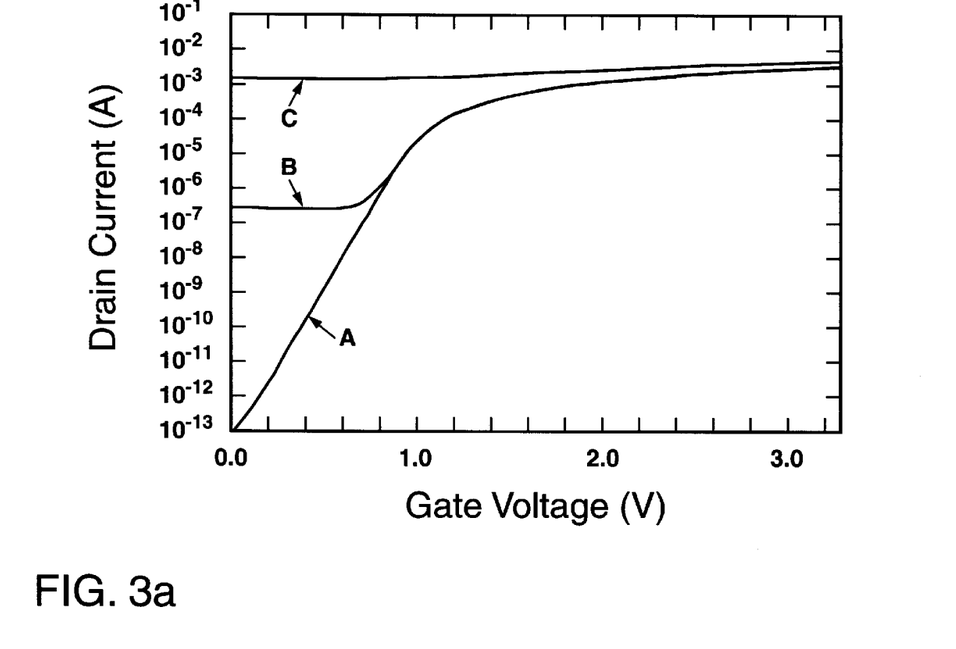
FIG. 3a shows computer simulations of the current-versus-voltage (I–V) characteristics of a conventional n-channel SOI field-effect transistor in response to various doses of ionizing radiation.

FIG. 3a shows the results of a three-dimensional simulation of a conventional partially-depleted n-channel SOI field-effect transistor with 10 μm×0.35 μm gate dimensions for operation at 3.3 V. These computer simulations show the response of this conventional device to various doses of ionizing radiation. In the computer simulations, the total-dose response of a particular transistor structure is calculated after providing a sheet of radiation-induced charge of a predetermined magnitude at the back-channel interface 36 (see FIG. 3b) and then determining the effect of this charge sheet on the subthreshold drain current versus gate voltage (I-V) characteristics of the transistor structure. In reality, charge generated in the buried oxide layer is nonuniformly trapped throughout the buried oxide layer, with the trapping efficiency and charge being dependent on the local electric field within the layer. The computer simulation is simplified by assuming a one-hundred percent trapping efficiency and charge yield, and in further assuming that all of the charge generated by the irradiation is trapped at the back-channel interface, thereby providing a worst-case total accumulated dose irradiation level. The simulations further assume a retrograde body doping profile with a back-channel doping level of $1\times10^{18}$ cm$^{-3}$, a device layer thickness of 180 nanometers, and a buried oxide layer thickness of 370 nanometers.

In FIG. 3a, the curve labelled "A" corresponds to the calculated response of a conventional transistor to a back-channel interface charge of $10^{12}$ cm$^{-2}$ which, in the simulation, can be generated by 3.4 kilorad (SiO$_2$) of irradiation to the buried oxide layer. It should be noted that 1 kilorad (SiO$_2$) of irradiation generates $8.1\times10^{15}$ electron-hole pairs per cubic centimeter within the buried oxide layer. The I-V curve "A" in FIG. 3a is not noticeably affected by this level of irradiation.

Figure 3B:
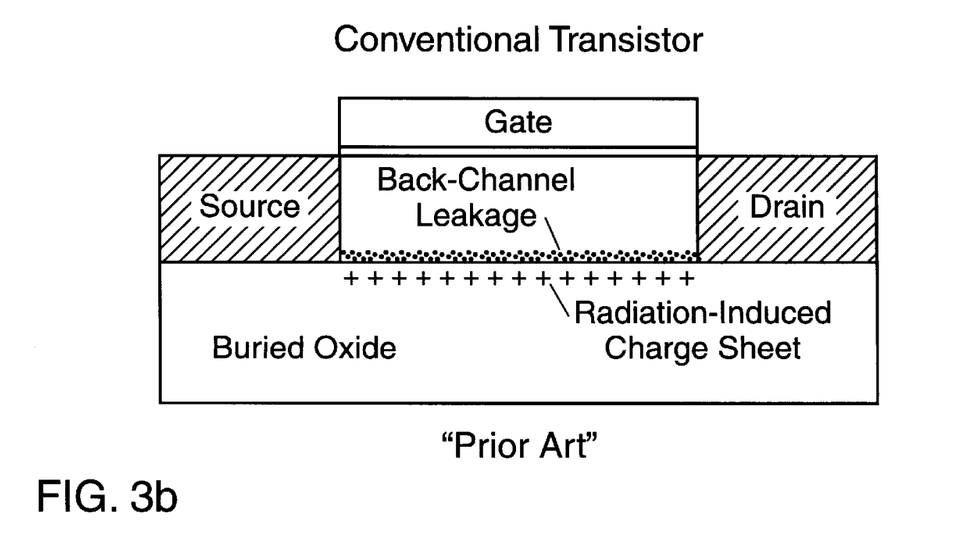
FIG. 3b schematically illustrates the formation of a back-channel leakage conduction path that is formed in the conventional transistor of FIG. 3a at high irradiation levels.

However, the I-V characteristics of the conventional transistor are significantly affected by a slight increase in the irradiation dose. This is seen in the calculated curve "B" at an interface charge of $3\times10^{12}$ cm$^{-2}$ corresponding to an irradiation dose of 10.3 kilorad (SiO$_2$) to the buried oxide layer, and more profoundly in the curve "C" at a slightly higher interface charge of $5\times10^{12}$ cm$^{-2}$ corresponding to an irradiation dose of 17.2 kilorad (SiO$_2$). The increased charge for curves "B" and "C" inverts the silicon near the interface and creates a direct back-channel leakage path between the source and drain regions as illustrated by the horizontal arrow in FIG. 3b. This leakage path results in a substantial leakage current conduction at the increased irradiation levels when 3.3 V of bias is applied to the drain in these simulations. FIGS. 3a and 3b show that the back-channel leakage current can be high even for relatively low levels of total-dose ionizing irradiation; and this can severely limit the lifetime of conventional SOI integrated circuits in space systems.

Figure 4A:
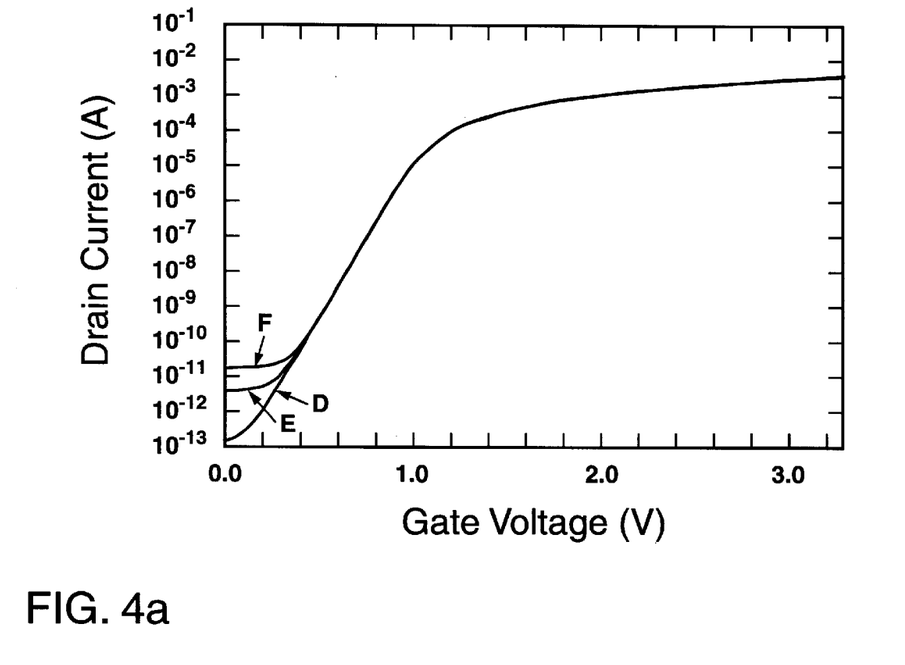
FIG. 4a shows computer simulations of the I-V characteristics of a radiation-hardened n-channel SOI field-effect transistor formed according to the present invention.

Computer simulations for a 10 $\mu$m×0.35 $\mu$m n-channel radiation-hardened SOI transistor with a retrograde body doping profile formed according to the present invention are shown in FIG. 4a. The I-V curve labelled "D" is calculated for an interface charge level of $10^{13}$ cm$^{-2}$ corresponding to 34.5 kilorad (SiO$_2$) of irradiation of the buried oxide layer 20. The I-V curve labelled "E" is calculated for an interface charge level of $10^{15}$ cm$^{-2}$ corresponding to 3.45 megarad (SiO$_2$) of irradiation of the layer 20. Finally, the I-V curve labelled "F" is calculated for an interface charge level of $10^{16}$ cm$^{-2}$ corresponding to 34.5 megarad (SiO$_2$) of irradiation of the layer 20. Even at these much higher irradiation levels, no back-channel leakage path is formed so that the transistor drain current is not substantially increased. Thus, according to the present invention it is possible to form an IC 10 having an improved radiation hardness without the need for a specially processed hardened buried oxide layer to minimize radiation-induced back-channel leakage.

Figure 4B:
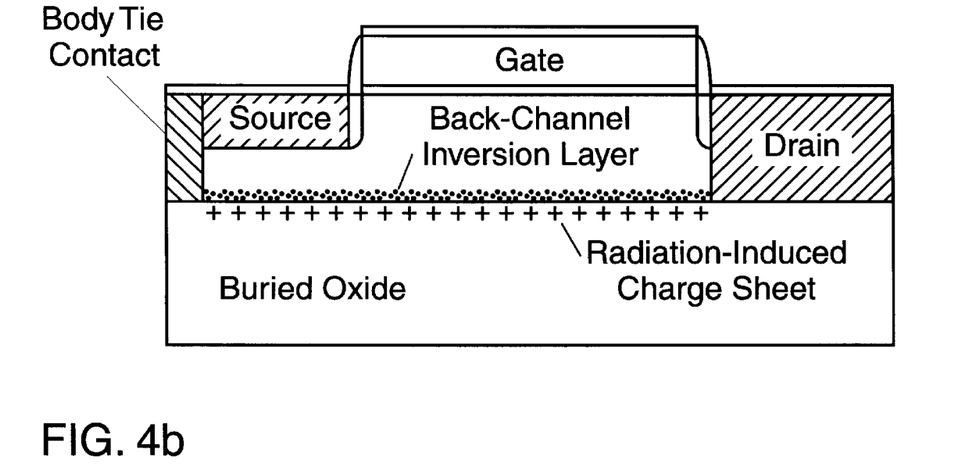
FIG. 4b schematically illustrates that no back-channel leakage conduction path is formed with the n-channel SOI transistor of FIG. 4a even though a back-channel inversion layer is generated at high irradiation levels.

This considerable improvement in radiation hardness according to the present invention is largely due to the design of the source 52 which extends only about halfway through the thickness of the device layer 22 as shown schematically in FIG. 4b. Although a back-channel inversion layer exists in the silicon island 28 due to the radiation-induced charge sheet, there is no direct conducting path formed between the source 52 and drain 54 because the source 52 is not deep enough to electrically connect to the inversion layer to form a back-channel leakage path. Furthermore a reverse-biased p-n junction is formed at an interface between the back-channel inversion layer and the body tie contact, thereby limiting any current conduction at this interface. The net result is an orders-of-magnitude improvement in total-dose radiation hardness according to the present invention as compared with conventional SOI technology.

The IC 10 in FIG. 1 can be completed by depositing and patterning one or more layers of metallization (not shown) to interconnect the various transistors and other elements (e.g. resistors and capacitors). Multiple layers of the interconnect metallization can be separated by dielectric layers (not shown), and a final passivation layer (not shown) can be provided to blanket the device 10 for environmental protection. The completed IC 10 can then be packaged for use.

As described herein, the SOI field-effect transistors 12 and 14 and the IC 10 formed therefrom present numerous advantages over conventional SOI technology. A BUSFET structure for these devices allows the devices to achieve high total-dose levels of radiation hardness without sacrificing dose-rate or SEU hardness. Furthermore, a BUSFET body tie layout of the devices wherein all regions of the channel width are directly electrically connected to the body tie may result in an even better dose-rate performance and SEU immunity than conventional radiation-hardened SOI devices. The present invention thus provides an ideal solution for space and weapon systems.

Floating body effects afflict conventional commercial SOI devices, creating threshold voltage instabilities, hysteresis effects, and reduced device reliability. These instabilities make circuit design difficult using conventional SOI technology, and result in increased design margins at the expense of circuit speed and power dissipation. Presently, circuit design models that adequately take into account floating body effects are not available. Finally, existing body tie structures consume large amounts of additional area, and thus are not compatible with advanced high-performance, high-density integrated circuits.

Thus, although the present invention provides radiation-hardening advantages, the present invention also provides additional advantages in reducing floating body effects. This provides the present invention with utility for forming transistors and integrated circuits for applications that do not require radiation hardening. Thus, the present invention is expected to be attractive to designers of commercial SOI circuits.

Finally, the body tie design of the present invention can address SEU radiation hardness which is becoming of increasing importance for reliability even for commercial applications on earth or in space. Because of the ever-decreasing feature sizes for ICs, these ICs are becoming more prone to single-event upset due to energetic cosmic rays that penetrate the earth's atmosphere and also to energetic particles generated during processing and packaging. The present invention provides an improvement in SEU hardness that addresses these concerns and can provide an increased reliability for both commercial and military ICs, thereby reducing the incidence of "soft errors" in the ICs.

Other applications and variations of the present invention will become evident to those skilled in the art. The actual scope of the invention is intended to be defined in the following claims when viewed in their proper perspective based on the prior art.

What is claimed is:

1. A silicon-on-insulator field-effect transistor, comprising:

(a) a silicon-on-insulator wafer further comprising:

a monocrystalline silicon substrate;

an insulating layer of silicon dioxide overlying the silicon substrate; and a monocrystalline silicon device layer overlying the insulating layer;

(b) a gate formed above the device layer;

(c) a multiply-doped drain formed on one side of the gate in the device layer and extending completely through the device layer, the drain further comprising a first lightly-doped portion formed with a first width and extending only partially through the device layer, with the first lightly-doped portion partially overlapping and extending laterally beyond a first heavily-doped portion that extends downward completely through the device layer;

(d) a multiply-doped source formed on the other side of the gate in the device layer and extending only partially through the device layer, the source further comprising a second lightly-doped portion and a second heavily-doped portion partially overlapping the second lightly-doped portion; and (e) a body tie contact formed adjacent to the source and electrically connected to the source.

2. The transistor of claim 1 further including a sidewall spacer on opposite sides of the gate above the drain and source.

3. The transistor of claim 2 wherein the sidewall spacer comprises silicon nitride or silicon dioxide.

4. The transistor of claim 1 wherein the gate comprises a layer of polysilicon overlying a layer of silicon dioxide.

5. The transistor of claim 1 wherein a region of the device layer between the source and drain is doped with dopant ions of a first conductivity type, and the drain and source are doped with dopant ions of a second conductivity type.

6. The transistor of claim 5 wherein the source extends only about half-way through the device layer.

7. The transistor of claim 5 wherein the body tie contact comprises an ion implanted region doped with dopant ions of the first conductivity type and with the ion implanted region extending at least partially through the device layer.

8. The transistor of claim 7 wherein the ion implanted region extends completely through the device layer.

9. The transistor of claim 1 wherein the body tie contact comprises an Ohmic contact.

10. The transistor of claim 1 wherein the device layer has a thickness of up to 500 nanometers.

11. The transistor of claim 1 wherein the electrical connection between the body tie contact and the source is provided by a source contact, and further including electrical contacts to the drain and gate.

12. The transistor of claim 11 wherein the drain, source and gate contacts comprise a metal or metal alloy.

13. The transistor of claim 11 wherein the drain, source and gate contacts comprise a metal silicide.

14. The transistor of claim 13 wherein the drain, source and gate contacts comprise titanium silicide.

15. A silicon-on-insulator field-effect transistor, comprising:
  (a) a silicon-on-insulator wafer further comprising:
    a monocrystalline silicon substrate;
    an insulating layer of silicon dioxide overlying the silicon substrate; and
    a monocrystalline silicon device layer overlying the insulating layer;
  (b) a gate formed above the device layer;
  (c) a drain formed on one side of the gate in the device layer and extending completely through the device layer;
  (d) a source formed on the other side of the gate in the device layer and extending only partially through the device layer, with a region of the device layer underlying the source and between the source and drain being doped with dopant ions of a first conductivity type to form a retrograde doping profile, and with the drain and source being doped with dopant ions of a second conductivity type;
  (e) a body tie contact formed adjacent to the source and electrically connected to the source; and
  (f) a sidewall spacer on opposite sides of the gate above the drain and source.

16. The transistor of claim 15 wherein the isolation region comprises a trench filled with a silicate glass.

17. The transistor of claim 15 wherein the sidewall spacer comprises silicon nitride or silicon dioxide.

18. The transistor of claim 15 wherein the gate further comprises a layer of polysilicon overlying a layer of silicon dioxide.

19. The transistor of claim 15 wherein a region of the device layer between the source and drain is doped with dopant ions of a first conductivity type, and the drain and source are doped with dopant ions of a second conductivity type.

20. The transistor of claim 19 wherein the region of the device layer between the source and drain has a retrograde doping profile.

21. The transistor of claim 19 wherein the source extends only about half-way through the device layer.

22. The transistor of claim 19 wherein the body tie contact comprises an ion implanted region doped with dopant ions of the first conductivity type and with the ion implanted region extending at least partially through the device layer.

23. The transistor of claim 22 wherein the ion implanted region extends completely through the device layer.

24. The transistor of claim 15 wherein the body tie contact comprises an Ohmic contact.

25. The transistor of claim 15 wherein the device layer has a thickness of up to 500 nanometers.

26. The transistor of claim 15 wherein the electrical connection between the body tie contact and the source is provided by a source contact, and further including electrical contacts to the drain and gate.

27. The transistor of claim 26 wherein the drain, source and gate contacts comprise a metal or metal alloy.

28. The transistor of claim 26 wherein the drain, source and gate contacts comprise a metal silicide.

29. The transistor of claim 28 wherein the drain, source and gate contacts comprise titanium silicide.

30. A radiation-hardened silicon-on-insulator field-effect transistor, comprising:
  (a) a silicon-on-insulator wafer further comprising:
    a monocrystalline silicon substrate;
    an insulating layer of silicon dioxide overlying the silicon substrate; and
    a monocrystalline silicon device layer overlying the insulating layer;
  (b) a gate formed above the device layer;
  (c) a multiply-doped drain formed on one side of the gate in the device layer and extending completely through the device layer, the drain further comprising a first lightly-doped portion formed with a first width and extending only partially through the device layer, with the first lightly-doped portion partially overlapping and extending laterally beyond a first heavily-doped portion that extends downward completely through the device layer;
  (d) a multiply-doped source formed on the other side of the gate in the device layer and extending only partially through the device layer, the source further comprising a second lightly-doped portion and a second heavily-doped portion partially overlapping the second lightly-doped portion; and
  (e) a body tie contact formed adjacent to the source and electrically connected to the source.

31. The radiation-hardened transistor of claim 30 further including a sidewall spacer on opposite sides of the gate above the drain and source.

32. The radiation-hardened transistor of claim 31 wherein the sidewall spacer comprises silicon nitride or silicon dioxide.

33. The radiation-hardened transistor of claim 30 wherein the gate comprises a layer of polysilicon overlying a layer of silicon dioxide.

34. The radiation-hardened transistor of claim 30 wherein a region of the device layer between the source and drain is doped with dopant ions of a first conductivity type, and the drain and source are doped with dopant ions of a second conductivity type.

35. The radiation-hardened transistor of claim 34 wherein the source extends only about half-way through the device layer.

36. The radiation-hardened transistor of claim 34 wherein the body tie contact comprises an ion implanted region doped with dopant ions of the first conductivity type and with the ion implanted region extending at least partially through the device layer.

37. The radiation-hardened transistor of claim 36 wherein the ion implanted region extends completely through the device layer.

38. The radiation-hardened transistor of claim 30 wherein the body tie contact comprises an Ohmic contact.

39. The radiation-hardened transistor of claim 30 wherein the device layer has a thickness of up to 500 nanometers.

40. The radiation-hardened transistor of claim 30 wherein the electrical connection between the body tie contact and the source is provided by a source contact, and further including electrical contacts to the drain and gate.

41. The radiation-hardened transistor of claim 40 wherein the drain, source and gate contacts comprise a metal or metal alloy.

42. The radiation-hardened transistor of claim 40 wherein the drain, source and gate contacts comprise a metal silicide.

43. The radiation-hardened transistor of claim 42 wherein the drain, source and gate contacts comprise titanium silicide.

44. A radiation-hardened silicon-on-insulator field-effect transistor, comprising:

(a) a silicon-on-insulator wafer further comprising:

a monocrystalline silicon substrate:

an insulating layer of silicon dioxide overlying the silicon substrate; and a monocrystalline silicon device layer overlying the insulating layer;

(b) a gate formed above the device layer;

(c) a drain formed on one side of the gate in the device layer and extending completely through the device layer;

(d) a source formed on the other side of the gate in the device layer and extending only partially through the device layer, with a region of the device layer between the source and drain being doped with dopant ions of a first conductivity type to form a retrograde doping profile, and with the drain and source being doped with dopant ions of a second conductivity type; and (e) a body tie contact formed adjacent to the source and electrically connected to the source.

* * * * *